(12) United States Patent
Freimuth et al.

(10) Patent No.: US 7,609,528 B2
(45) Date of Patent: *Oct. 27, 2009

(54) MODULAR INSTALLATION DEVICE

(75) Inventors: Michael Freimuth, Hirschau (DE); Fritz Royer, Hahnbach (DE)

(73) Assignee: Siemens Aktiengesellschaft, Munich (DE)

( * ) Notice: Subject to any disclaimer, the term of this patent is extended or adjusted under 35 U.S.C. 154(b) by 182 days.

This patent is subject to a terminal disclaimer.

(21) Appl. No.: 10/542,004

(22) PCT Filed: Nov. 10, 2003

(86) PCT No.: PCT/DE03/03716

§ 371 (c)(1),
(2), (4) Date: Apr. 27, 2006

(87) PCT Pub. No.: WO2004/068645

PCT Pub. Date: Aug. 12, 2004

(65) Prior Publication Data

US 2006/0245169 A1    Nov. 2, 2006

(30) Foreign Application Priority Data

Jan. 13, 2003   (DE) ................ 103 01 003

(51) Int. Cl.
  *H05K 7/18* (2006.01)
(52) U.S. Cl. .......... 361/801; 361/732; 439/166
(58) Field of Classification Search ........ 361/801, 361/622, 624, 637, 728, 929, 732, 735; 438/166, 438/358, 701, 715, 717
See application file for complete search history.

(56) References Cited

U.S. PATENT DOCUMENTS 5,231,365 A * 7/1993 Kato ................ 335/132

(Continued)

FOREIGN PATENT DOCUMENTS

CN    1238064    1/1998

(Continued)

OTHER PUBLICATIONS

Partial English language translation and Statement of Relevance of JP 63-176349.

(Continued)

*Primary Examiner*—Dean A. Reichard
*Assistant Examiner*—Xiaoliang Chen
(74) *Attorney, Agent, or Firm*—Harness, Dickey & Pierce, P.L.C.

(57) ABSTRACT

An installation device includes connecting modules which, are easy to replace under aggravated conditions of access, while requiring little space. The device is provided with a retaining device for a supporting structure to be coupled thereto and additionally with a housing with integrated module slots for the connecting modules. In order to specifically assign the connecting modules to the module slots, the device is provided with one coding device for each module slot and one mating coding device for each connecting module. The device is also provided with one snap-in device on at least one of the module slots and one mating snap-in device on at least one of the connecting modules to lock and unlock the connecting modules in the corresponding module slots. One contact element each having a long side is provided for each module slot and one connecting module each is provided with one mating contact element, the contact elements being contacted with the mating contact element at an angle to its long side.

14 Claims, 2 Drawing Sheets

U.S. PATENT DOCUMENTS

| | | | | |
|---|---|---|---|---|
| 5,318,461 A * | 6/1994 | Frikkee et al. | | 439/715 |
| 5,609,245 A * | 3/1997 | Cassity et al. | | 200/283 |
| 5,629,831 A * | 5/1997 | Eggert et al. | | 361/624 |
| 5,652,420 A * | 7/1997 | Innes et al. | | 200/50.32 |
| 5,984,734 A * | 11/1999 | Piper et al. | | 439/717 |
| 6,027,379 A * | 2/2000 | Hohorst | | 439/715 |
| 6,081,048 A * | 6/2000 | Bergmann et al. | | 307/147 |
| 6,231,400 B1 * | 5/2001 | Nagai | | 439/701 |
| 6,332,812 B1 * | 12/2001 | Kazuhara | | 439/701 |
| 6,783,403 B2 * | 8/2004 | Lafragette et al. | | 439/717 |
| 6,961,233 B2 * | 11/2005 | Hoeing et al. | | 361/622 |
| 2002/0072266 A1 * | 6/2002 | Lange | | 439/358 |
| 2002/0072268 A1 | 8/2002 | Nixon | | |
| 2004/0106331 A1 * | 6/2004 | Hoegener et al. | | 439/701 |
| 2006/0134956 A1 * | 6/2006 | Freimuth et al. | | 439/166 |

FOREIGN PATENT DOCUMENTS

| | | |
|---|---|---|
| DE | 90 00 398 U1 | 5/1990 |
| DE | 94 20 189 U1 | 6/1995 |
| DE | 44 02 001 A1 | 7/1995 |
| DE | 296 06 735 U1 | 8/1996 |
| DE | 196 05 698 C1 | 4/1997 |
| DE | 196 50 988 A | 6/1998 |
| DE | 296 06 759 U1 | 8/1998 |
| DE | 199 02 811 C | 9/2000 |
| JP | 63176349 | 11/1988 |
| JP | 8163812 | 8/1996 |
| JP | 9056111 | 2/1997 |
| JP | 10084191 | 3/1998 |
| JP | 10105849 | 4/1998 |
| JP | 11135171 | 5/1999 |
| JP | 2003283163 | 10/2003 |

OTHER PUBLICATIONS

Phoenix Contact: Leiterplattenanschluss Combicon 2002, Seiten 3, 318.

* cited by examiner

MODULAR INSTALLATION DEVICE

This application is the national phase under 35 U.S.C. § 371 of PCT International Application No. PCT/DE2003/003716 which has an International filing date of Nov. 10, 2003, which designated the United States of America and which claims priority on German Patent Application number DE 103 01 003.3 filed Jan. 13, 2003, the entire contents of which are hereby incorporated herein by reference.

FIELD

The invention generally relates to a modular service or installation device.

BACKGROUND

The Phoenix product catalog entitled "Leiterplattenanschluss COMBICON 2002" [COMBICON 2002 printed circuit board connection] discloses, for example on pages 3 and 318, a modular installation device which is provided with a housing and a top-hat rail holder and has removable screw terminal blocks which are provided with block-standardized coding for the purpose of supplying the blocks in the correct position, claw-like projections for the purpose of fixing them to the housing and contact needles with which contact is to be made axially. Such an installation device is used, for example, as a rail-mounted device in a switchgear cabinet and acts as a switching and/or protective switching device, signal converter or the like for the purpose of converting switching and/or control concepts.

DE 196 50 998 A1 discloses an electrical terminal block, to whose end faces terminals are also attached which in this case automatically make contact with an attachment end contact of the terminal block, this attachment end contact for its part being electrically connected to the installed or plugged-on electronics via a terminal-internal line.

DE 199 02 811 C1 discloses a coding apparatus and a coding method for an electrical device, the electrical device having a first component having a first coding element section and a second component, which can be connected to the first component, having a second coding element section which can be assembled with the first coding element section during assembly to form a single coding element.

SUMMARY

At least one embodiment of the invention includes an object of specifying a service or installation device which is provided with connection modules and which can be replaced in a simple manner, just as the connection modules, in the case of difficult access conditions. In at least one embodiment, it is possible for the connection modules to be secured against unintentional release on the device side in the case of a low space requirement and to be coupled in a manner in which they cannot become confused, it being possible for contact to be made with the connection modules.

The retaining device(s) makes it possible in a simple manner for the service or installation device according to at least one embodiment of the invention to be fixed or released manually, i.e. by hand and thus without the use of a tool, to or from a bearing device(s). It is further possible for contact to be made with the connection modules which can be provided at predetermined module locations on the service device by use of associated opposing contact device(s) on the contact device(s) which are integrated on the device side, to be precise transversely with respect to their longitudinal side. It is further possible for the connection modules to be arranged at the module locations by way of coding device(s) and opposing coding device(s) such that they cannot become confused and such that they can be secured by way of latching device(s) and opposing latching device(s) against unintentional release.

A result is that the plugging and unplugging direction, which is produced therefrom essentially perpendicular to the contact means or vertical to the upper side of the device, of the connection modules indicates that coupling and, respectively, decoupling can be achieved in a simple manner and with a low space requirement. This is true even under difficult access conditions, for example in the case of already wired connection modules. Advantageous during decoupling is a short withdrawal path which makes it possible to prevent high-risk tightening of connected conductors.

The latching device(s) of the service device is advantageously in the form of an elastic lock having a barb, and the opposing latching device(s) is advantageously in the form of a latch accommodating the barb. The result is that release of the lock from the latch or the corresponding connection module from the service device, in particular using the latching and opposing latching device(s) which are arranged on the inside of the housing, is only possible by way of a tool, i.e. with safety in mind.

The service device may advantageously be provided with, in each case, one insulating device at the module locations. The insulating device(s) may be arranged on the end and/or longitudinal side on the corresponding contact device(s), or covering the corresponding contact device(s). With such an arrangement, protection against touching contact in accordance with regulations is improved or even ensured with regard to the exposed and possibly voltage-carrying contact device(s) in the event of the connection module having been removed.

The respective insulating device(s) may also be in the form of an insulating bracket, in particular in the form of a plug-in element which can be integrated in the housing, by which the contact device(s) to be covered for reasons of protection against touching contact can be secured in a simple manner.

BRIEF DESCRIPTION OF THE DRAWINGS

The invention and advantageous refinements in accordance with the features of the further claims will be explained in more detail below with reference to example embodiments illustrated in the drawings, in which:

DETAILED DESCRIPTION OF THE EXAMPLE EMBODIMENTS

Figure 1:
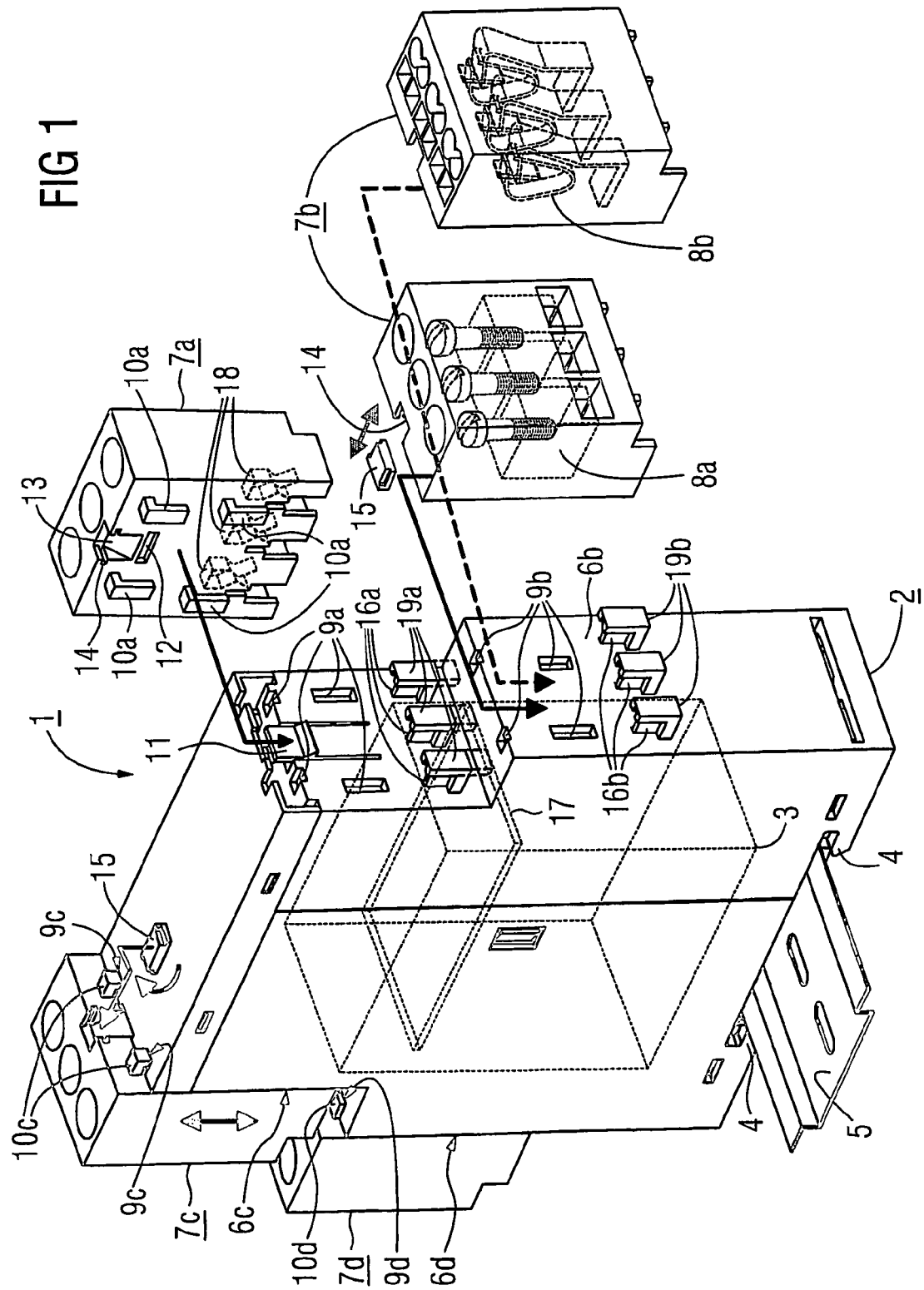
FIG. 1 shows a perspective illustration of a service device of an embodiment having arranged connection modules and further connection modules which can be arranged.

FIG. 1 shows a modular service device 1 having a housing 2 which advantageously has a schematically illustrated electrical, electromagnetic or electronic device unit 3. The intended use of the service device 1 can be determined by the replaceable device unit 3. The service device 1 has a retaining device 4 which is integrated in the housing 2 and is provided for a bearing device 5, which can be coupled to the retaining device 4. The bearing device 5 is mounted, for example, in a distribution board, switchgear cabinet or the like, with the result that the service device 1 which has been snapped onto it has a fixed installation position. Further details will be given on the retaining device 4 in the description relating to FIG. 2.

The service device 1 or the housing 2 is also provided with two or more module locations 6a-6d, a first and a second module location 6a and 6b being provided on an end side of the housing 2 for a first and second connection module 7a and 7b, respectively, which can be arranged at said module locations 6a and 6b. A third and a fourth module location 6c and 6d, which are arranged on another end side, are each fitted with an associated third and fourth connection module 7c and 7d, respectively.

It is therefore not necessary to completely replace a device in the event of a defect in or maintenance work on a wired device. Such a complete replacement would also require all of the connection device(s) or all of the lines to be detached.

In a manner representative of the other connection modules 7b-7d, the connection module 7b is advantageously provided in each case with a multi-pole connection device. Two embodiments of the connection module 7b show firstly a simplified illustration of the screw terminal 8a and secondly a simplified illustration of the spring-loaded terminal 8b as the connection device. Of course other embodiments, such as an insulation displacement contact or the like, can be used. The connection devices are each determined for a single- or multi-core line (not illustrated here) which can be connected thereto.

A first and a second coding device 9a and 9b are provided on a housing wall at the first and the second module locations 6a and 6b, respectively. The two coding devices 9a and 9b each correspond to an associated first opposing coding device 10a and to a second opposing contact device (not illustrated here), respectively. The first opposing contact device 10a and the second opposing contact device are part of a first and a second connection module 7a and 7b, respectively. Both the contact devices 9a, 9b and the first opposing contact device 10a and the second opposing contact device serve the purpose of providing module location-specific assignment, i.e. assignment which cannot become confused, of the first and second connection module 7a and 7b, respectively, on the housing 2.

The same applies to the third and fourth module locations 6c and 6d which are each provided with a third and a fourth coding devices 9c and 9d, respectively. The third and fourth coding devices 9c and 9d are each compatible with an associated third and fourth opposing coding devices 10c and 10d, respectively, of the third and fourth connection modules 7c and 7d, respectively, which can be arranged. The coding devices 9a-9d at the module locations 6a-6d of the housing 2 and the opposing coding devices 10a-10d on the connection modules 7a-7d are therefore coded overall with respect to one another in a simple manner. This applies both to connection modules on one connection side and to connection modules on different connection sides, with the result that an assignment error and therefore, under certain circumstances, destruction of a device can be avoided.

In this case, by way of example, the first coding device 9a of the first module location 6a is formed by four recesses in the housing wall which are formed by housing sections. The recesses or else apertures are different in terms of their locations, positions and/or dimensions than those of the second coding device 9b for individualization purposes. The first opposing coding device 10a is in this exemplary embodiment in the form of a bracket element and is designed in terms of its location, position and/or dimensions so as to correspond to the recesses in the first coding device 9a, with the result that it is not possible for it to be confused with, for example, the second or third connection module 7b or 7c.

The bracket elements advantageously act at the same time as fixing hooks for the connection modules 7a-7d on the housing 2 of the service device 1. The same naturally also applies to all other module locations 6b-6d and connection modules 7b-7d, an individual design for the respective coding devices 9b-9d and the corresponding second or third and fourth opposing coding device 10c and 10d being provided per module location 6b-6d. In a further refinement, the coding devices 9a-9d can also be provided on the respective connection modules 7a-7d, the opposing coding devices 10a-10d being arranged on the housing 2 with a suitable alignment.

The first module location 6a also has, on the end side, a latching device 11 in the housing wall of the housing 2. The third module location 6c is likewise equipped with such a latching device (not illustrated here).

An opposing latching device 12, which, in interaction with the latching device 11, serves the purpose of providing module location-specific locking and unlocking of the first connection module 7a in the sense of a locking mechanism, is provided on the first connection module 7a. Unintentional release of the first connection module 7a is thus ruled out. Even in the event of tensile forces occurring, which may be introduced via a connected line, release of the connection modules is ruled out. This is of significance insofar as release under load conditions may lead to contact erosion and to overheating and, in the most unfavorable case, to destruction of the device owing to a resultant arc formation.

The same similarly applies to the third connection module 7c, the latching device 11 latching with the opposing latching device 12 once the connection modules 7a-7d have been pushed on. The latching device 11 is in the form of an elastic lock having a barb. The lock for its part includes integral or multi-part, resilient elements.

The latching device 11 is advantageously part of the housing wall, as a result of which a simple embodiment which has reduced manufacturing complexity is provided. The opposing latching device 12 is also of simple design, namely in the form of a latch accommodating the barb. In the context of at least one embodiment of the invention, the lock can also be integrated in one of the connection modules 7a-7d or the latch can be integrated in the housing 2 of the service device 1. The latch which is in the form of a recess in a wall of the first connection module 7a is arranged at one end of a ramp 13, by which the lock can be released, for example by use of a screwdriver.

A slot-shaped receptacle 14 for a closure element 15 which can be inserted therein is provided at another end of the ramp 13. The closure element 15 in the inserted state blocks the access to the lock and thus prevents unlocking of the locking mechanism, with the result that undesired disassembly or removal of the first connection module 7a can be prevented. Owing to the physical overlapping of the first connection module 7a with respect to the second connection module 7b in the state in which it is mounted on the service device 1, a separate locking mechanism for the second connection module 7b is superfluous, since it can be removed only once the first connection module 7a has been released.

A first contact device 16a is arranged on one end side, in particular at the first module location 6a, of the housing 2. A second contact device 16b is provided, analogously to the first module location 6a, at the second module location 6b which is set back in the form of a step. The contact devices 16a, 16b which protrude on the end side are part of a so-called contact carrier (not shown here). The contact carrier is placed and fixed on a printed circuit board 17 of the device unit 3. The contact carrier acts, inter alia, as an electrically conductive connection between the contact devices 16a, 16b and the printed circuit board 17. The first connection module 7a which is associated with the first contact device 16a is provided with an opposing contact device 18 (illustrated in simplified form) which is arranged within the first connection module 7a behind a cutout in the associated module housing.

The first contact device 16a forms, together with the opposing contact device 18, a connection interface between the service device 1 and the first connection module 7a. The first contact device 16a has a longitudinal side which is aligned with an upper side of the service device 1. When the first connection module 7a is fed to the first module location 6a of the service device 1 in the direction of the first contact device 16a and along one end side, the first contact device 16a can make contact with the opposing contact device 18 transversely with respect to the longitudinal side of the first contact device 16a, which results in a perpendicular contact-making direction or vertical coupling and decoupling direction.

In contrast to an installation device having a horizontal coupling and decoupling direction with respect to the connection modules, disassembly of the connection modules 7a-7d is also increased or even ensured with the present service device 1 in the case of a small spacing between the rows, for example in the switchgear cabinet.

The first contact device 16a is advantageously in the form of a group of flat contact elements, in particular in the form of contact tongues or contact lugs or in the form of contact pins. The flat contact elements are arranged with their flat side parallel to side faces of the housing 2, their number being freely selectable.

In order to maintain the compatibility, the opposing contact device 18 is advantageously in the form of a group of fork-shaped contact elements, as a result of which a simple electrically conductive contact connection which favors contact is provided. The opposing contact device 18 is representative of all other opposing contact means of the further connection modules 7b-7d. In this case, a releasable connection to the flat contact elements is provided by way of the fork-shaped contact elements (also referred to as spring contacts or tulip contacts). Similarly, these physical designs are also reproduced at the other module locations 6b-6d or on the other connection modules 7b-7d.

Stamped, bent parts (not shown here), which provide an electrically conductive connection on the one hand to the respective connection device and on the other hand to the corresponding opposing contact device, are integrated, inter alia, in the individual connection modules 7a-7d. An embodiment of the service device 1 can also be realized, of course, with fork-shaped contact elements, in the case of which the flat contact elements are part of a connection module.

A first and a second insulating device 19a and 19b are arranged in the form of a touching contact protection device on the end and longitudinal side on the first and the second contact device 16a and 16b, for example. The respective insulating device 19a and 19b, in the form of a group of insulating elements, covers the associated contact device 16a and 16b, respectively, with the result that touching contact with the possibly voltage-carrying contact device 16a and 16b, respectively, once the connection modules 7a and 7b, respectively, have been withdrawn is advantageously ruled out.

The insulating devices 19a, 19b, which in the present example are in the form of insulating brackets or insulating projections illustrated by dashed lines, increase or even ensure that the requirements of relevant standards are adhered to, for example those of EN 61140 "Schutz gegen elektrischen Schlag" [Protection against electric shock]. In one advantageous development, the insulating devices 19a, 19b, which are also referred to as finger touch-safe tabs, may also be in the form of plug-in elements which can be integrated in the housing 2. When the housing 2 is appropriately designed with corresponding receptacles, modification of such insulating means can easily be carried out. Similarly, the insulating devices 19a, 19b can of course also be provided on the connection modules 7a-7d, in particular in the case of an embodiment with flat contact elements.

The feed direction of the connection modules 7a-7d, which is predetermined on the basis of the contact-making direction, in accordance with the assembly sequence illustrated by way of feed arrows results in the design for the coding and opposing coding devices 9a-9d and 10a-10d, the latching and opposing latching devices 11 and 12 and the insulating devices 19. The coding and opposing coding devices 9a-9d and 10a-10d, the latching and opposing latching devices 11 and 12 and the insulating device 19 can likewise be realized by embodiments which have the same effect but are different than the previously mentioned devices with regard to the advantageous exemplary embodiments described.

Coupling and decoupling of the first connection module 7a to the service device 1 takes place, in a manner representative of the further connection modules 7b-7d, essentially perpendicular to the longitudinal axis of the first contact device 16a. Coupling of the respective connection modules 7a-7d to the module locations 6a-6d results in an arrangement which brings about electrical contact-making and a mechanical connection including coding and locking in the sense of an operative connection. This results in comfortable access even in the case of a narrow arrangement of the service device 1, for example between wiring channels in a switchgear cabinet.

As long as one or more of the connection modules 7a-7d are intended to be removed for repair or modification purposes, first unlocking of the locking mechanism takes place by use of a tool. In this case, the barb of the lock is pressed out of the latch, and the corresponding connection module can be removed. On reassembly, a clear assignment of all of the released connection modules to the corresponding module location is ensured on the basis of the coding and opposing coding devices 9a-9d and 10a-10d.

Figure 2:
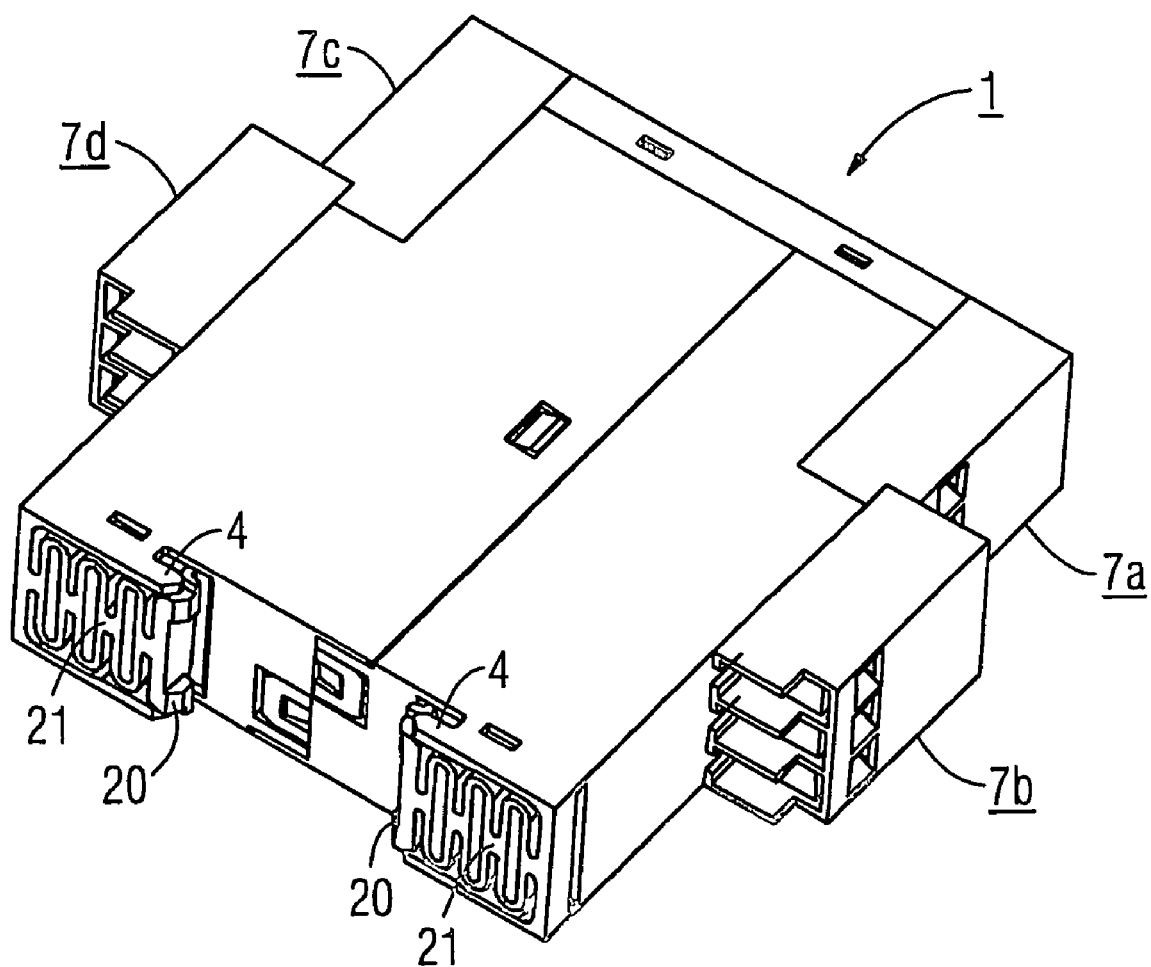
FIG. 2 shows a perspective illustration of a service device of an embodiment having a plurality of connection modules arranged.

FIG. 2 shows a further perspective illustration of the service device 1, in the case of which in each case two of the connection modules 7a-7d in their final, mounted position on the housing 2 are electrically and mechanically connected parallel to one or the other end face. The retaining device 4 which is integrated in the housing 2 has two mutually opposing latching elements 20 which, as part of the retaining device, are designed such that they are loaded, in terms of the bearing device 5 which can be provided therebetween, with a respectively associated spring element 21 and are therefore designed to be self-ringing. The respective latching element 20 is of integral design with the corresponding spring element 21 next to an inclined bevel, the spring element 21 itself being part of the housing 2. This results in a low number of parts and reduced manufacturing complexity.

It is advantageously possible with the spring-loaded retaining device 4 for the service device 1, which is to be replaced, is possibly defective and is difficult to access, to be released from the bearing device 5, in the form of a top-hat rail. This can be done in a simple manner by a force (manual pulling or pushing) counter to a spring force of one of the two spring elements 21 being introduced until the corresponding latching element 20 is deflected in a sprung manner over the edge of the top-hat rail. By way of a pivotal movement, away from the top-hat rail, the service device 1 can then be lifted off so as to disassemble it without the use of a tool, i.e. manually, counter to the spring force.

The at least one embodiment of invention explained above can be summarized as follows:

In order to specify a service device 1 which is provided with connection modules 7a-7d and is intended to be replaceable in a simple manner, just as the connection modules 7a-7d, in the case of a low space requirement under difficult access conditions, provision is made for a housing 2 having module locations 6a-6d for the connection modules 7a-7d to also be provided in addition to a retaining device 4 for a bearing device 5 which can be coupled thereto. In this case, on the one hand a coding device 9a-9d per module location 6a-6d and an opposing coding device 10a-10d per connection module 7a-7d are arranged for the purpose of providing module location-specific assignment and, on the other hand, a latching device 11 is arranged at at least one of the module locations 6a-6d, and an opposing latching device 12 is arranged on at least one of the connection modules 7a-7d, for the purpose of providing module location-specific locking and unlocking. A contact device 16a, 16b having a longitudinal side is provided per module location 6a-6d, and an opposing contact device 18 is provided per connection module 7a-7d, it being possible for the contact devices 16a, 16b to make contact with the opposing contact device 18 transversely with respect to its longitudinal side.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A modular device, comprising:
   a retaining device for a bearing device, coupleable thereto;
   a housing including a plurality of predetermined module locations;
   connection modules, arrangeable at the module locations and each provided with a connection device for connecting a line thereto;
   coding means and opposing coding means, for providing module location-specific assignment;
   latching means at at least one of the module locations, and opposing latching means on at least one of the connection modules, for respectively providing module location-specific locking and unlocking; and
   contact means, having a longitudinal side for making contact with opposing contact means, transversely with respect to the longitudinal side.

2. The modular device as claimed in claim 1, further comprising at least one of an electrical, electromagnetic and electronic device unit.

3. The modular device as claimed in claim 1, wherein the retaining device includes at least one spring-loaded and self-ringing latching element.

4. The modular device as claimed in claim 1, wherein at least one of the connection modules is of a multi-pole design.

5. The modular device as claimed in claim 1, wherein each respective connection device includes at least one of a screw terminal, a spring-loaded terminal and an insulation displacement contact.

6. The modular device as claimed in claim 1, wherein the coding means includes, individually per module location, a recess formed by housing sections, and the opposing coding means includes a bracket element.

7. The modular device as claimed in claim 1, wherein the latching means includes an elastic lock having a barb, and the opposing latching means includes a latch accommodating the barb.

8. The modular device as claimed in claim 1, wherein the contact means includes at least one of a contact lug and a contact pin, and the opposing contact means includes a fork-shaped contact element.

9. The modular device as claimed in claim 1, further comprising:
   insulating means, arranged at least one of on an end and on a longitudinal side of the contact means, for covering the contact means.

10. The modular device as claimed in claim 9, wherein the insulating means includes an insulating bracket.

11. The modular device as claimed in claim 9, wherein the insulating means includes a plug-in element integrated in the housing.

12. The modular device as claimed in claim 8, further comprising:
   insulating means, arranged at least one of on an end and on a longitudinal side of the contact means, for covering the contact means.

13. The modular device as claimed in claim 12, wherein the insulating means includes an insulating bracket.

14. The modular device as claimed in claim 12, wherein the insulating means includes a plug-in element integrated in the housing.

* * * * *